United States Patent

Kurokawa et al.

[11] Patent Number: 5,525,455
[45] Date of Patent: Jun. 11, 1996

[54] TREATING SOLUTION FOR LITHOGRAPHIC PRINTING PLATE

[75] Inventors: Hiroyuki Kurokawa; Kazuhiko Ibaraki; Jun Urasaki; Akio Yoshida, all of Tokyo, Japan

[73] Assignee: Mitsubishi Paper Mills Limited, Tokyo, Japan

[21] Appl. No.: 379,251

[22] Filed: Jan. 27, 1995

Related U.S. Application Data

[63] Continuation-in-part of Ser. No. 203,364, Mar. 1, 1994, abandoned.

[30] Foreign Application Priority Data

Aug. 19, 1993 [JP] Japan ................................. 5-205407
Mar. 8, 1994 [JP] Japan ................................. 6-036770

[51] Int. Cl.⁶ .................................. G03F 7/07; G03C 8/00
[52] U.S. Cl. .......................... 430/204; 430/248; 430/264; 430/302; 101/466
[58] Field of Search ................................. 430/204, 248, 430/302, 264; 101/466

[56] References Cited

U.S. PATENT DOCUMENTS

| | | | |
|---|---|---|---|
| 3,904,412 | 9/1975 | Serrien et al. | 430/204 |
| 4,298,673 | 11/1981 | Kubotera et al. | 430/204 |
| 4,361,639 | 11/1982 | Kanada et al. | 430/204 |
| 4,563,410 | 1/1986 | De Jaeger et al. | 430/204 |
| 5,053,319 | 10/1991 | Barnett et al. | 430/204 |
| 5,118,583 | 6/1992 | Kondo et al. | 430/204 |
| 5,124,229 | 6/1992 | De Keyzer et al. | 430/204 |
| 5,200,294 | 4/1993 | De Keyzer et al. | 430/204 |
| 5,202,218 | 4/1993 | Yoshida et al. | 430/204 |
| 5,324,622 | 6/1994 | Van Rompuy et al. | 430/204 |

FOREIGN PATENT DOCUMENTS

| | | |
|---|---|---|
| 0547660 | 6/1993 | European Pat. Off. |
| 2349527 | 4/1974 | Germany |
| 3933969 | 4/1990 | Germany |
| 847436 | 9/1960 | United Kingdom |
| 2081183 | 2/1982 | United Kingdom |

*Primary Examiner*—Richard L. Schilling
*Attorney, Agent, or Firm*—Cushman Darby & Cushman

[57] ABSTRACT

The present invention provides a treating solution for lithographic printing plates having ink receptive silver images in which the compound having a mercapto group or a thione group and an oleophilic group which is added to improve ink-receptivity can be solubilized without damaging the ink-receptivity and with using no solvent and in which hydrophilic colloid particles are excellent in time stability. The solution contains at least one alkanolamine and a compound having a mercapto group or a thione group and an oleophilic group and being free from sulfo group and carboxyl group. Preferably, the solution additionally contains an amino acid and hydrophilic colloid particles which are inorganic fine particles having an average particle size of 0.1 μm or less.

9 Claims, No Drawings

TREATING SOLUTION FOR LITHOGRAPHIC PRINTING PLATE

This application is a continuation-in-part application of parent application Ser. No. 08/203,364, filed on Mar. 1, 1994 abandoned.

BACKGROUND OF THE INVENTION

The present invention relates to a treating solution for lithographic printing plates in which silver images are utilized as ink-receptive portions, said treating solution improving ink-receptivity of the image portions at the beginning of printing and inhibiting non-image portions from staining.

Printing plates made using silver halide emulsions having a high sensitivity and capable of being spectrally sensitized have already been put to practical use. Of these printing plates, offset printing plates in which silver images are utilized as ink-receptive portions are disclosed in U.S. Pat. Nos. 3,721,559 and 3,490,905, Japanese Patent Kokoku No. 48-30562, U.S. Pat. Nos. 3,385,701 and 3,814,603, Japanese Patent Kokoku No. 44-27242, Japanese Patent Kokai No. 53-21602, U.S. Pat. Nos. 3,454,398, 3,764,323 and 3,099,209, and Japanese Patent Kokai No. 53-9603.

Methods for making these printing plates are roughly classified into some types, but they are common in that the silver images are rendered ink receptive. A lithographic printing plate comprises an oleophilic image portion which is receptive to inks and a hydrophilic non-image portion which receives water. In usual lithographic printing, both water and ink are fed to the surface of the printing plate to allow the image portion to receive preferentially the colored ink and the non-image portion to receive preferentially water and then the ink on the image is transferred onto a substrate such as paper.

Accordingly, in order to obtain prints of good quality, it is required that the difference of oleophilicity or hydrophilicity between the surface of the image and that of the non-image be sufficiently large.

The above-mentioned methods for making printing plates using silver halide emulsions have favorable features that they are simple, sure and rapid methods and can be automated and furthermore, can provide printing plates of high sensitivity, high resolution and high image reproducibility. However, the difference of oleophilicity or hydrophilicity between the surface of the image and that of the non-image of the resulting printing plates is not sufficiently large as compared with printing plates (PS plate) made using organic colloid such as diazo light-sensitive materials.

As an approach for solving these problems, British Patent No. 1,373,415 and Japanese Patent Kokai No. 58-127928 disclose to improve the ink receptivity by acting a compound having a mercapto group or a thione group and an oleophilic group on silver image. That is, it is considered that the mercapto group of the compound is adsorbed to the silver image and the oleophilic portion of the compound covers the silver image and as a result, the difference of oleophilicity or hydrophilicity between the image portion and the non-image portion becomes relatively large.

However, most of the compounds having mercapto group are water-insoluble or soluble only in alkali solutions since they do not have water-soluble groups such as sulfo group and carboxyl group, and these compounds in weakly acidic region of pH 5–7 required for treating solutions aimed at by the present invention do not dissolve in water, and organic solvents such as ethyl alcohol and isopropyl alcohol have been used for dissolving the compounds.

On the other hand, as a means to inhibit stain of non-image portions, U.S. Pat. Nos. 3,829,319, 4,220,702 and 4,361,639 disclose to improve hydrophilicity of the surface of printing plate by adsorbing hydrophilic colloid particles having an average particle size of 0.1 µm or less such as colloidal silica and colloidal alumina which are inorganic particles onto the surface of lithographic printing plates to form a hydrophilic layer on the surface. That is, the hydrophilic colloid particles such as colloidal silica cover the non-image portion to increase the hydrophilicity of the non-image portion to inhibit the non-image portion from staining.

However, the hydrophilic colloid particles such as colloidal silica have the problem in stability of the solution with time, especially stability at high temperatures. That is, when the solution is stored at high temperatures, the colloid particles tend to precipitate and this tendency sometimes becomes conspicuous depending on the coexisting other components, especially compounds having a mercapto group or the like.

Recently, it is increasingly demanded to reduce use of organic solvents, especially organic solvents having a low boiling point of lower than 100° C. such as methanol, ethanol and isopropanol from the points of environmental problems and safety. For this purpose, for example, it is proposed to solubilize the compounds having mercapto group with surface active agents. The use of surface active agents is considered to be effective as a solubilizing method, but the solublization with active agents has the defect that since the compound having mercapto group is present in the micelle, sufficient ink-receptivity cannot be attained by the compound.

SUMMARY OF THE INVENTION

An object of the present invention is to solubilize compounds having mercapto group or thione group in the weakly acidic region of pH 5–7 required for treating solutions such as stabilizing solution (neutralizing solution) and etch solution (sensitizing solution) using substantially no organic solvents and without damaging the effect of the compounds to improve the ink-receptivity.

Another object of the present invention is to provide a treating solution for the surface of lithographic printing plates in which the compound having mercapto group or thione group is solubilized using substantially no organic solvent as mentioned above and hydrophilic colloid particles having an average particle size of 0.1 µm or less such as colloidal silica, namely, inorganic fine particles and used for inhibiting the stain of non-image portion do not precipitate even with lapse of time at high temperatures.

The above objects have been attained by providing a treating solution having a pH of 5–7 for lithographic printing plates in which silver images are utilized as ink-receptive portions wherein the treating solution contains a compound having a mercapto group or a thione group and an oleophilic group and being free from sulfo group and carboxyl group and an alkanolamine and preferably additionally contains an amino acid and hydrophilic colloid particles having an average particle size of 0.1 µm or less such as colloidal silica which are inorganic fine particles.

DESCRIPTION OF THE INVENTION

The alkanolamines used in the present invention include, for example, amino alcohols such as monoethanolamine, diethanolamine, triethanolamine and aminoethylethanolamine. These amine compounds are available from Nippon Nyukazai Co., Ltd., Koei Kagaku Kogyo Co., Ltd. and others.

The compounds having a mercapto group or a thione group and an oleophilic group used in the present invention are described, for example, in British Pat. No. 1373415 and Japanese Pat. Kokai No. 58-127928 and basically have the structure comprising a mercapto group or a thion group and an oleophilic group.

The compounds having mercapto group or thione group used in the present invention preferably have the following formula.

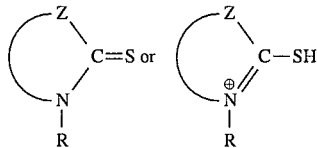

(wherein R represents a hydrogen atom, an alkyl group having 12 or less carbon atoms, an aryl group, an aralkyl group or allyl group and Z represents a group of remainder atoms necessary to form a 5- or 6-membered ring together with N and C in the formula).

Specific examples of 5- or 6-membered ring are imidazole, imidazoline, thiazole, thiazoline, oxazole, oxazoline, pyrazoline, triazole, thiadiazole, oxadiazole, tetrazole, pyridine, pyrimidine, pyridazine, pyrazine and triazine. These rings may be condensed rings of two or more or may be condensed with benzene ring or naphthalene ring.

Examples of the above compounds are 2-mercapto-4-phenylimidazole, 2-mercapto-1-benzylimidazole, 2-mercapto-benzimidazole, 1-ethyl-2-mercaptobenzimidazole, 2-mercapto-1-butyl-benzimidazole, 1,3-diethyl-benzimidazoline-2-thione, 1,3-dibenzylimidazolidine-2-thione, 2,2'-dimercapto-1,1'-decamethylene-diimidazoline, 2-mercapto-4-phenylthiazole, 2-mercapto-benzothiazole, 2-mercapto-naphthothiazole, 3-ethyl-benzothiazoline-2-thione, 3-dodecyl-benzothiazoline-2-thione, 2-mercapto-4,5-diphenyloxazole, 2-mercaptobenzoxazole, 3-pentyl-benzoxazoline-2-thione, 1-phenyl-3-methylpyrazoline-5-thione, 3-mercapto-4-allyl-5-pentadecyl-1,2,4-triazole, 3-mercapto-5-nonyl-1,2,4-triazole, 3-mercapto-4-acetamide-5-heptyl-1,2,4-triazole, 3-mercapto-4-amino-5-heptadecyl-1,2,4-triazole, 2-mercapto-5-phenyl-1,3,4-thiadiazole, 2-mercapto-5-n-heptyl-oxathiazole, 2-mercapto-5-phenyl-1,3,4-oxadiazole, 2-heptadecyl-5-phenyl-1,3,4-oxadiazole, 5-mercapto-1-phenyl-tetrazole, 2-mercapto-5-nitropyridine, 1-methyl-quinoline-2(1H)-thione, 2-mercapto-4-hydroxy-6-pentadecylpyridine, 3-mercapto-4-methyl-6-phenyl-pyridazine, 2-mercapto-5,6-diphenylpyrazine, 2-mercapto-4,6-diphenyl-1,3,5-triazine and 2-amino-4-mercapto-6-benzyl-1,3,5-triazine. The mercapto compound or the like is contained in an amount of preferably 0.1–3 g/l, more preferably 0.5–1 g/l in the treating solution.

The weight ratio of the alkanolamine to the mercapto compound is preferably 5:1–30:1, more preferably 10:1–20:1 and the alkanolamine is added to and mixed with the mercapto compound at the above ratio in water. Thereafter, if necessary, to the resulting mixed solution are added other compounds or the resulting mixed solution is added to a solution containing other additives.

The solvent is substantially water. If an organic solvent having a boiling point of 100° C. or lower is contained, this is contained in an amount of preferably less than about 20% by weight, more preferably less than about 10% by weight.

Examples of the hydrophilic colloid particles are colloidal silica and colloidal alumina.

Amount of the hydrophilic colloid particles is preferably 2–30 g, more preferably 5–20 g per 1 liter of the working treating solution.

Examples of the amino acids used in the present invention are glycine, alanine, glutamic acid, aspartic acid, leucine, cysteine and lysine. These are not limited.

The weight ratio of the amino acid to the hydrophilic colloid particles is preferably 0.5:1–10:1, more preferably 1:1–5:1. After addition of the amino acid, if necessary, other compounds are added to the resulting mixed solution.

As explained above, the present invention relates to a treating solution for improving the ink-receptivity of the surface of lithographic printing plates at the starting of printing, in said printing plates the silver image being utilized as the ink-receptive portion, and the treating solution is applied to the surface of the printing plates after developing treatment and before the starting of printing. The treating solution may contain generally used buffer, preservative, storage stabilizer, wetting agent, surface active agent and desensitizing agent in addition to the above-mentioned compounds. For example, the treating solution can contain inorganic acids such as phosphoric acid and sulfuric acid, organic acids such as succinic acid and propionic acid, water-soluble synthetic polymers such as polyvinyl alcohol and polyacrylic acid, natural polymers such as gum arabic and hydroxy-cellulose, polyol compounds such as polyethylene glycol and glycerol, inorganic fine particles such as colloidal silica and complexing agents such as iminodiacetic acid and ethylenediaminetetraacetic acid.

Regarding the lithographic printing plates in which silver image is utilized as ink-receptive portion, the silver halide emulsion may be present on the printing master plate per se or may be present on a separate negative sheet as a silver source for printing master sheet having an image receiving layer to be processed by silver complex diffusion transfer process.

The silver halide emulsion may be any of silver chloride, silver bromide, silver chlorobromide and these silver halides containing iodides. Binder for the emulsion is preferably gelatin and a part or the whole of the gelatin may be replaced with other colloid materials such as casein, albumin and cellulose derivatives. The silver halide can be used in an amount of 0.5–7 g/m$^2$ in terms of silver nitrate and the binder can be used in an amount of 0.5–10 g/m$^2$.

The silver halide emulsion can be prepared by the processes known in the photographic industry and processes for preparing the silver halide emulsion used especially for printing plates are also disclosed in the patent publications cited hereabove and these can be referred to.

Generally, the lithographic printing plates used in the present invention are exposed imagewise and then processed with an alkali developer. The developers can be any of normal photographic developers containing developing agent such as hydroquinone, developers for silver complex diffusion transfer process containing hypo, high alkali developers prepared by activating the above-mentioned developers, and the like.

The present invention is illustrated by the following nonlimiting examples.

EXAMPLE 1

A matting layer containing silica particles having an average particle size of 5μ was provided on one side of a polyester film support subjected to a subbing treatment. On another side of the support were provided an undercoat layer (adjusted to pH 4) for antihalation containing carbon black in such an amount as giving a light reflectance of 3% and silica powders having an average particle size of 7μ in an amount of 20% by weight based on the photographic gelatin and a layer of a high-sensitivity silver chloride emulsion (adjusted to pH 4) which was spectrally sensitized to green region and contained silica powders having an average particle size of 7μ in an amount of 5% by weight based on the photographic gelatin after chemical sensitization.

The application rate of gelatin in the undercoat layer was 3.5 g/m$^2$ and that of gelatin in the emulsion layer was 0.8 g/m$^2$ and that of the silver halide was 1.0 g/m$^2$ in terms of silver nitrate. The undercoat layer and the emulsion layer contained 5.0 mg of formaldehyde as a hardener for 1 g of gelatin. After drying, the coated support was heated at 40° C. for 14 days. Then, on the emulsion layer was coated a nuclei coating solution described in Example 2 (plate No. 31) of Japanese Pat. Kokai No. 54-103104 and was dried to obtain a lithographic printing plate. The above silver halide emulsion contained 4×10$^{-6}$ mol of rhodium chloride for 1 mol of silver halide which had been added during physical ripening of the emulsion. The silver halide emulsion had an average grain size of 0.4μ.

The thus obtained lithographic printing plate material was exposed imagewise by a process camera having an image reversing mechanism, developed with the following developer (working solution) at 30° C. for 30 seconds and successively treated with the following stabilizing solution.

| <Developer> | |
|---|---|
| Sodium hydroxide | 24 g |
| Potassium hydroxide | 8 g |
| Anhydrous sodium sulfite | 50 g |
| 2-Methyl-2-amino-1-propanol | 30 g |
| Water was added to make up 1 liter in total. | |
| <Stabilizing solution> | |
| Phosphoric acid | 1.2 g |
| Sodium phosphate monobasic | 25 g |
| Anhydrous sodium sulfite | 2.5 g |
| Ethylene glycol | 5 g |
| Colloidal silica (20% aqueous solution) | 1 g |
| Water was added to make up 1 liter in total. | |

The solution was adjusted to pH 6.

The following treating solution was applied to the surface of the thus obtained printing plate and printing was carried out using AB-Dick 1250 (offset printing machine manufactured by A.B.-Dick Co.) as a printing machine, AB-Dick 3-1012 (sumi (black) ink manufactured by A.B.-Dick Co.) as an ink and SLM-OD30 (dampening solution manufactured by Mitsubishi Paper Mills Ltd.) as a dampening solution.

| <Treating solution> | |
|---|---|
| Citric acid | 2 g |
| Sodium citrate | 2 g |
| Polyethylene glycol | 29 g |
| Colloidal silica (20% aqueous solution) | 11 g |
| 2-Mercapto-5-n-heptyl-oxadiazole | 1 g |
| Mercapto compound solubilizing agent | X g |
| Amino acid | Y g |
| Water was added to make up 1 liter in total. | |

The solution was adjusted to pH 6.

Combinations of the mercapto compound with solubilizing agent are as shown in the following Table 1.

TABLE 1

| Sample No. | Solubilizing agent | Amount (X g) | Amino acid | Amount (Y g) |
|---|---|---|---|---|
| 1 | No | — | Glycine | 10 |
| 2 | Ethanol | 350 | No | — |
| 3 | SUR-1 | 20 | Glycine | 10 |
| 4 | SUR-2 | 20 | " | 10 |
| 5 | Triethanolamine | 20 | " | 10 |
| 6 | 2-Aminomethyl-ethanolamine | 20 | " | 10 |
| 7 | Dimethylamino-ethanolamino | 20 | " | 10 |
| 8 | Triethanolamine | 20 | No | — |
| 9 | Triethanolamine | 20 | Glutamic acid | 10 |

In Table 1, SUR-1 means polyoxyethyleneoctylphenyl ether and SUR-2 means sodium stearylbenzenesulfonate.

The ink-receptivity was evaluated in the following manner. That is, simultaneously with contacting the surface of the printing plate with ink, feeding of papers was started and the ink-receptivity was expressed in terms of the number of papers fed until a print with good image density was obtained. The solution stability was tested by leaving the solution at 10° C. for 2 days (solution stability A) and at 50° C. for 2 weeks (solution stability B). The results are shown in Table 2.

TABLE 2

| Sample No. | Ink receptivity | Solution stability A | Solution stability B |
|---|---|---|---|
| 1 | 60 | Crystal precipitated | Crystal precipitated |
| 2 | 10 | Transparent liquid | Transparent liquid |
| 3 | 58 | " | " |
| 4 | 60 | Cloudy liquid | Cloudy liquid |
| 5 | 8 | Transparent liquid | Transparent liquid |
| 6 | 11 | " | " |
| 7 | 10 | " | " |
| 8 | 11 | " | Cloudy liquid |
| 9 | 10 | " | Transparent liquid |

It can be seen from the above results that according to the present invention, ink-receptivity similar to that attained by conventional solubilization with solvents has been attained without using solvents. Furthermore, the treating solutions of the present invention were superior in stability. Satisfactory ink-receptivity and solution stability could not be obtained by mere reduction in the amount of solvent or by use of surface active agent.

EXAMPLE 2

Example 1 was repeated except that the following mercapto compounds were used in place of 2 -mercapto-5-n-heptyl-oxadiazole.

2-Mercapto-4-phenylimidazole
3-Dodecyl-benzothiazoline-2-thione
3-Mercapto-4-amino-5-heptadecyl-1,2,4-triazole
2-Amino-4-mercapto-6-benzyl-1,3,5-triazine The results of evaluation of ink-receptivity were similar to those of Example 1 and the compounds having mercapto group or the like could be dissolved in the treating solution without using solvents and in addition, the effect to improve ink-receptivity was also recognized.

According to the present invention, the compounds having a mercapto group or a thione group and an oleophilic group which are usually added to the treating solutions for lithographic printing plates can be solubilized without damaging the effect and without using solvents.

Furthermore, occurrence of stain in the non-image portion can be inhibited using hydrophilic colloid particles stably.

EXAMPLE 3

Printing plates were made in the same manner as in Example 1 except that the following stabilizing solution was used in place of the one used in Example 1 and printing was carried out in the same manner as in Example 1. Dampening water was used as a surface treating solution.

| <Stabilizing solution> | |
|---|---|
| Phosphoric acid | 2.5 g |
| Sodium phosphate monobasic | 25 g |
| Anhydrous sodium sulfite | 2.5 g |
| 2-Mercapto-5-n-heptyl-oxadiazole | 1 g |
| Mercapto compound solubilizing agent | X g |
| Colloidal silica (20% aqueous solution) | 1 g |

Water was added to make up 1 liter in total and the solution was adjusted to pH 6.

As the mercapto compound solubilizing agents, those of Sample Nos. 2–9 in Table 1 were used.

The results of evaluation of ink-receptivity were similar to those of Example 1. The compounds having mercapto group or the like contained in the treating solution could be dissolved without using solvents and furthermore, the effect to improve ink-receptivity was also recognized.

EXAMPLE 4

Example 3 was repeated except that the following mercapto compounds were used in place of 2-mercapto-5-n-heptyl oxadiazole.
2-Mercapto-4-phenylimidazole
3-Dodecyl-benzothiazoline-2-thione
3-Mercapto-4-amino-5-heptadecyl-1,2,4-triazole
2-Amino-4-mercapto-6-benzyl-1,3,5-triazine The results of evaluation of ink-receptivity were similar to those of Example 3. The compounds having mercapto group or the like contained in the treating solution cold be dissolved without using solvents and furthermore, the effect to improve ink-receptivity was also recognized.

What is claimed is:

1. A method for improving ink-receptivity of lithographic printing plates having silver images utilized as ink-receptive portions which comprises applying to the surface of the lithographic printing plates a treating solution having a pH of 5 to 7, containing 10% by weight or less of an organic solvent having a boiling point of 100° C. or lower and containing at least one compound having an oleophilic group and a mercapto group or a thione group and being free from sulfo group and carboxyl group, and an alkanolamine.

2. A method according to claim 1, wherein the treating solution containing substantially no organic solvent and having a pH of 5–7 is used as a stabilizing solution.

3. A method according to claim 1, wherein the compound having an oleophilic group and a mercapto group or a thione group has the following formula:

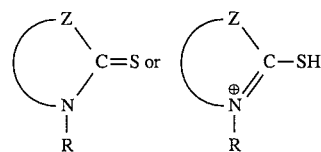

wherein R represents a hydrogen atom, an alkyl group having 12 or less carbon atoms, an aryl group, an aralkyl group or an allyl group and Z represents a group of the remainder atoms necessary to form a 5- or 6-membered ring together with N and C in the formula.

4. A method according to claim 1, wherein content of the compound having an oleophilic group and a mercapto group or a thione group is 0.1–3 g/l.

5. A method according to claim 1, wherein the weight ratio of the alkanolamine and the compound having an oleophilic group and a mercapto group or a thione group is 5:1–30:1.

6. A method according to claim 1, wherein the treating solution additionally contains hydrophilic colloid particles having an average particle size of 0.1 μm or less and an amino acid.

7. A method according to claim 6, wherein the hydrophilic colloid particles are colloidal silica particles or colloidal alumina particles.

8. A method according to claim 6, wherein amount of the hydrophilic colloid particles is 2–30 g/l.

9. A method according to claim 6, wherein the weight ratio of the amino acid and the hydrophilic colloid particles is 0.5:1–10:1.

* * * * *